(12) United States Patent
Bedeschi

(10) Patent No.: US 9,105,314 B2
(45) Date of Patent: Aug. 11, 2015

(54) PROGRAM-DISTURB DECOUPLING FOR ADJACENT WORDLINES OF A MEMORY DEVICE

(75) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 614 days.

(21) Appl. No.: 13/457,799

(22) Filed: Apr. 27, 2012

(65) Prior Publication Data

US 2013/0290604 A1 Oct. 31, 2013

(51) Int. Cl.
  *G06F 12/00* (2006.01)
  *G11C 8/08* (2006.01)
  *G06F 12/02* (2006.01)
  *G11C 13/00* (2006.01)

(52) U.S. Cl.
  CPC .............. *G11C 8/08* (2013.01); *G06F 12/023* (2013.01); *G06F 12/0238* (2013.01); *G11C 13/0004* (2013.01); *G11C 13/0033* (2013.01); *G11C 13/0069* (2013.01)

(58) Field of Classification Search
  CPC .. G11C 13/0069; G11C 13/0033; G11C 8/08; G06F 12/023; G06F 12/0238
  USPC ........................................................ 711/103
  See application file for complete search history.

(56) References Cited

U.S. PATENT DOCUMENTS

| | | | |
|---|---|---|---|
| 7,266,741 B2 | 9/2007 | Luk | |
| 7,308,471 B2 | 12/2007 | Rumynin | |
| 7,352,605 B2 * | 4/2008 | Kang et al. | 365/145 |
| 7,630,257 B2 | 12/2009 | Madan et al. | |
| 7,701,765 B2 | 4/2010 | Aritome | |
| 7,952,922 B2 | 5/2011 | Aritome | |
| 7,984,360 B2 | 7/2011 | Sharon et al. | |
| 8,031,526 B1 | 10/2011 | Wu et al. | |
| 8,050,086 B2 | 11/2011 | Shalvi et al. | |
| 8,144,505 B2 | 3/2012 | Lee | |
| 8,169,825 B1 | 5/2012 | Shalvi et al. | |
| 8,228,701 B2 | 7/2012 | Sokolov et al. | |
| 8,238,157 B1 | 8/2012 | Sommer et al. | |
| 8,300,478 B2 | 10/2012 | Shalvi et al. | |
| 8,310,876 B2 | 11/2012 | Yoo et al. | |
| 8,335,107 B2 | 12/2012 | Lee | |
| 8,369,147 B2 | 2/2013 | Aritome | |
| 8,391,062 B2 | 3/2013 | Jang | |
| 8,437,185 B2 | 5/2013 | Shalvi et al. | |
| 8,462,548 B2 | 6/2013 | Aritome | |
| 8,570,804 B2 | 10/2013 | Shalvi et al. | |
| 8,593,873 B2 | 11/2013 | Cerafogli et al. | |
| 8,681,543 B2 | 3/2014 | Jang | |
| 8,693,247 B2 | 4/2014 | Yoon et al. | |
| 8,717,792 B2 | 5/2014 | Sokolov et al. | |
| 8,743,622 B2 | 6/2014 | Tanzawa | |

(Continued)

FOREIGN PATENT DOCUMENTS

WO   WO 2008085254   7/2008

OTHER PUBLICATIONS

Patent Application titled "Encoding Program Bits to Decouple Adjacent Wordlines in a Memory Device," U.S. Appl. No. 13/435,243, filed Mar. 30, 2012, 24 Pages.

*Primary Examiner* — Aracelis Ruiz

(74) *Attorney, Agent, or Firm* — Knobbe, Martens, Olson & Bear, LLP

(57) ABSTRACT

Subject matter disclosed herein relates to memory operations regarding programming bits into a memory array.

20 Claims, 4 Drawing Sheets

(56) References Cited

U.S. PATENT DOCUMENTS

| | | |
|---|---|---|
| 8,767,469 B2 | 7/2014 | Kim |
| 8,910,000 B2 | 12/2014 | Bedeschi |
| 2004/0225705 A1 | 11/2004 | Rumynin |
| 2006/0123288 A1 | 6/2006 | Luk |
| 2007/0255891 A1 * | 11/2007 | Chow et al. .......... 711/103 |
| 2008/0084773 A1 | 4/2008 | Madan et al. |
| 2008/0158948 A1 | 7/2008 | Sharon et al. |
| 2010/0020615 A1 | 1/2010 | Miwa et al. |
| 2010/0265764 A1 | 10/2010 | Yoo et al. |
| 2012/0127801 A1 | 5/2012 | Kim |
| 2012/0195118 A1 | 8/2012 | Yang |
| 2012/0262970 A1 | 10/2012 | Sokolov et al. |
| 2012/0262971 A1 | 10/2012 | Sokolov et al. |
| 2012/0268990 A1 | 10/2012 | Sommer et al. |
| 2012/0290897 A1 | 11/2012 | Yoon et al. |
| 2013/0007353 A1 | 1/2013 | Shim et al. |
| 2013/0141972 A1 | 6/2013 | Yoon et al. |
| 2013/0141974 A1 | 6/2013 | Jang |
| 2013/0167251 A1 | 6/2013 | Pio |
| 2013/0235665 A1 | 9/2013 | Khaef |
| 2013/0262743 A1 | 10/2013 | Bedeschi |
| 2013/0279260 A1 | 10/2013 | Yoon et al. |
| 2013/0311837 A1 | 11/2013 | Bedeschi |

* cited by examiner

PROGRAM-DISTURB DECOUPLING FOR ADJACENT WORDLINES OF A MEMORY DEVICE

BACKGROUND

1. Field

Subject matter disclosed herein relates to memory operations regarding programming bits into a memory array.

2. Information

Memory devices may be employed in various electronic devices, such as computers, cell phones, PDA's, data loggers, or navigational equipment, just to name a few examples. For example, various types of nonvolatile memory devices may be employed, such as solid state drives (SSD), NAND or NOR flash memory, or phase change memory, among others. In general, writing or programming operations may be used to store information, while read operations may be used to retrieve stored information.

Phase change memory (PCM) may operate based, at least in part, on behavior or properties of one or more particular phase change materials, such as chalcogenide glass or germanium antimony telluride (GST), just to name a few examples. Electrical resistivities of crystalline or amorphous states of such materials may be different from one another, thus presenting a basis by which information may be represented or expressed. The amorphous, high resistance state may represent a stored first binary state and the crystalline, low resistance state may represent a stored second binary state. Of course, such a binary representation of stored information is merely an example. PCM may also be used to store multiple memory states, represented by varying degrees of phase change material resistivity, for example.

Nonvolatile memory devices, such as PCM, may comprise wordlines and bitlines to program an array of memory cells. As density of memory cells in an array increase, distances between adjacent wordlines or bitlines may decrease. Decreased spacing among wordlines or bitlines may lead to undesirable effects, such as capacitive coupling, crosstalk, or memory disturb, just to name a few examples.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
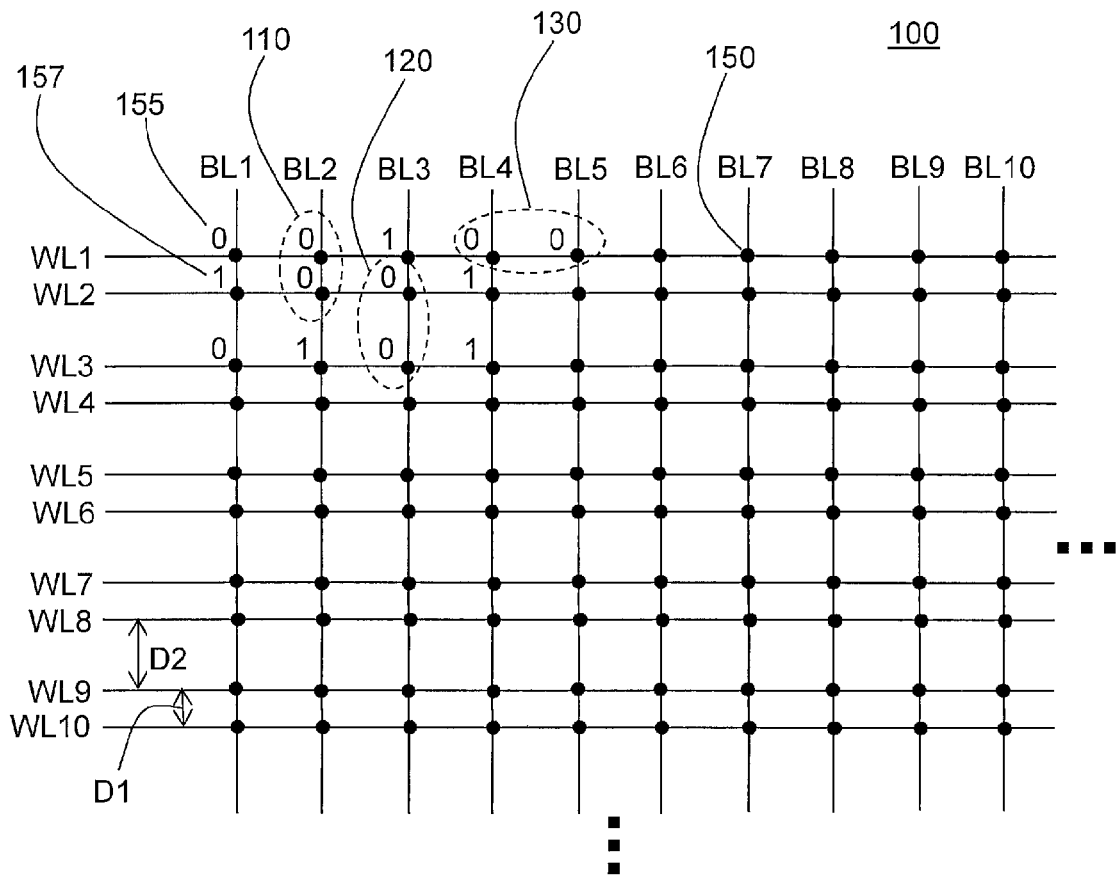
FIG. 1 is a schematic diagram of a portion of a memory array, according to an embodiment.

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

A phase change memory (PCM) cell, if used to store a binary logic value, may be set or reset to one of two states. For example, an amorphous, high resistance state may represent a stored first binary state (e.g., a zero-bit) and a crystalline, low resistance state may represent a stored second binary state (e.g., a one-bit). A PCM cell may be programmed to a zero-bit by resetting the PCM cell to an amorphous state by applying a relatively high amplitude, relatively short duration electrical programming pulse or signal so as to melt and then cool phase change material of the PCM cell. A PCM cell may be programmed to a one-bit by setting the PCM cell to a crystalline state by crystallizing phase change material.

A memory array comprising PCM cells may be programmed using wordlines or bitlines that provide electrical programming pulses or signals representing one-bits or zero-bits in individual PCM cells. While one wordline may be used to program one row of PCM cells, an adjacent wordline may be used to program an adjacent row of PCM cells. Adjacent rows of PCM cells may be spaced apart to provide structural, electrical, or thermal insulation between the adjacent rows. However, as the density of PCM cells in an array increase, spacing between adjacent rows of PCM cells may decrease, thus reducing an amount of available semiconductor material providing thermal insulation between the adjacent rows. Among other things, thermal contact among PCM cells may undesirably lead to an increased likelihood that a state of one PCM cell may be disturbed by the state of a neighboring PCM cell. A PCM cell thermally affecting another PCM cell may be called a "proximity-disturb" event, which may include a "program disturb" event or a "read disturb" event, depending on whether a program process or a read process is involved. For example, a zero-bit of a PCM cell may be cyclically re-programmed with a particular frequency in a process of refreshing the state of the PCM cell. Such re-programming a zero-bit may comprise applying a relatively high amplitude electrical programming pulse or signal so as to melt and then cool phase change material of the PCM cell, as mentioned above. A process of melting phase change material of the PCM cell, however, may inadvertently add heat to one or more neighboring PCM cells. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. As the frequency of refreshing the state of a PCM cell increases, so does the likelihood of occurrence of a program-disturb event, induced by increasing ambient temperatures of a memory array, for example.

PCM cells in a zero-bit, amorphous state may be more susceptible to effects of a program-disturb event compared to PCM cells in a one-bit, crystalline state. Such effects may change a PCM memory cell in a zero-bit state to a one-bit state or vise versa. For example, a program-disturb event may erroneously change a state of a PCM cell from a zero-bit state to a one-bit state. This may be true, at least in part, because an amorphous state may comprise a meta-stable state with respect to a relatively stable crystalline state. Additional energy applied to such an amorphous state (via thermal or electrical energy, for example) may accelerate a crystallization process. Such additional energy may comprise ambient thermal energy from neighboring PCM cells being repeatedly programmed, as mentioned above. In this case, heat generated during programming operation of neighboring PCM cells may diffuse from the neighboring PCM cells to accelerate crystallization of another PCM cell in a zero-bit, amorphous state. In another implementation, a read-disturb event may occur if a PCM cell is read many times during a relatively short period of time to create excess heat.

Two or more PCM cells in adjacent wordlines on particular bit lines of a memory array may lead to undesirable effects of a program-disturb event, as explained above. For example, a PCM cell in a zero-bit state may program-disturb another PCM cell in a zero-bit state. Embodiments described herein include processes or electronic architecture to reduce a likelihood of occurrence of a program-disturb event. For example, one embodiment may involve a process of programming one-bits on two adjacent word lines before programming zero-bits on the adjacent word lines of a memory array, as explained in detail below.

In an embodiment, a method to reduce a likelihood of occurrence of a program-disturb event may comprise arranging program bits to be written to a memory array into a buffer so as to write the bits to two adjacent wordlines at a time. Such program bits may comprise zero-bits and one-bits. Here, writing bits to two wordlines "at a time" means that the bits are written to two wordlines in a particular process that substantially concurrently involves the two wordlines. For example, bits may be written to two wordlines "at a time" in a process that operates back-and-forth between writing some bits to one wordline and writing some bits to the other wordline. Once a process of writing to two wordlines "at a time" is completed, a subsequent process of writing to another two wordlines "at a time" may begin, and so on. In other words, a plurality of wordlines may be written to by a process of writing to the wordlines two at a time in a sequential fashion.

A buffer may comprise a program buffer that may be included in a memory device that also includes a memory array. In an implementation, a memory array may include a program buffer. For example, a portion of a memory array may be defined to comprise a program buffer. In such a case, a memory controller, for example, may address a memory array according to whether bits are to be written to the memory array or to the buffer, though claimed subject matter is not limited in this respect. Such a buffer may comprise memory to temporarily store a plurality of bits during a process of writing the bits to two adjacent wordlines of a memory array. Bits may be written to the two adjacent wordlines in a particular sequence based, at least in part, on whether the bits comprise one-bits or zero-bits, as explained below. As discussed above, occurrence of a write-disturb event between adjacent memory cells may be more likely in a process of writing zero-bits to both adjacent memory cells compared to writing one-bits.

A buffer may receive two groups (e.g., words or bytes) of program bits from a processor or memory controller and store one portion of the groups of program bits while another portion of the groups of program bits is written to a memory array. One group of program bits may be written to a first wordline of the memory array and the other group of program bits may be written to a second wordline. Subsequently, yet another portion of the groups of program bits may be written to the memory array, and so on until the complete groups of program bits have been written to the memory array. The buffer may then receive another group of program bits to be written to the memory array. One-bits of the two groups of bits may be written to the two adjacent wordlines before writing zero-bits to the two adjacent wordlines. Such an order of writing one-bits before writing zero-bits may be beneficial in that a program-disturb event may be relatively unlikely to occur while writing one-bits. Further, a particular process of subsequently writing zero-bits, described below, may reduce likelihood of an occurrence of program-disturb.

In a particular embodiment, program bits may comprise a first group of bits to be written to a first of two adjacent wordlines, and a second group of bits to be written to a second of the two adjacent wordlines. In such a case, one-bits of a first group of bits may be written to the first wordline before writing one-bits of a second group of bits to the second wordline. Subsequent to one-bits of the first and second groups of bits being written to the two wordlines, zero-bits may be written to the two wordlines in the following manner. Zero-bits of the first group of bits that are to be written to the first wordline may be written to memory cell locations that are immediately adjacent to one-bits of the adjacent second wordline. Likewise, zero-bits of the second group of bits that are to be written to the second wordline may be written to memory cell locations that are immediately adjacent to one-bits of the adjacent first wordline. Here, one bit being "immediately adjacent" to another bit means that there are no intervening bits present between the adjacent bits. Also, a memory cell location on one wordline being immediately adjacent to a one-bit of an adjacent wordline means that the memory cell location and the one-bit are on a same bitline. A reason for considering relative positions of bits while writing zero-bits may as follows: Writing a zero-bit to a memory cell adjacent to a memory cell already storing a one-bit may likely not involve a program-disturb.

In another embodiment, subsequent to one-bits of the first and second groups of bits being written to the two wordlines, zero-bits of a first group of bits may be written to a first wordline, and zero-bits of a second group of bits may be written to a second wordline. In a particular implementation, zero-bits may be written to the first wordline while simultaneously writing zero-bits to the second wordline. In the latter embodiment, relative positions of bits (e.g., whether bits are adjacent to one another or not) need not be considered. A beneficial reason for simultaneously writing zero-bits to both wordlines may be as follows: Writing zero-bits to adjacent memory cells may include a program-verify process. A program-disturb event may erroneously switch a zero-bit to a one-bit. But the program-verify process may correct the one-bit back to a zero-bit, for example. Thus, simultaneously writing zero-bits to both wordlines may include a program-verify process that may help ensure that zero-bits are stored in the wordlines as intended. On the other hand, if zero-bits were written to one wordline before the other, then the formerly-written wordline may include a bit erroneously switched by a program-disturb event that may occur while writing the latter wordline. Further, there may not be a program-verify process (e.g., that accompanies a write process) to correct such an erroneously switched bit, since this wordline has already been written to.

In an embodiment, a non-volatile memory device may include an ability to reduce a likelihood of occurrence of a program-disturb event. For example, such a memory device may comprise a controller to arrange program bits to be written to a memory cell array into a buffer so as to write the bits to two adjacent wordlines at a time. The controller may further write one-bits to the two adjacent wordlines before writing zero-bits to the two adjacent wordlines. For example, such program bits may comprise a first group of bits to be written to a first of two adjacent wordlines, and a second group of bits to be written to a second of the two adjacent wordlines. A first group of bits and a second group of bits may comprise respective words or bytes, though claimed subject matter is not so limited. A controller may comprise circuitry to write one-bits of a first group of bits to a first wordline before writing one-bits of a second group of bits to a second wordline. In one implementation, such a controller may comprise circuitry to write zero-bits of a first group of bits that are immediately adjacent to one-bits of a second group, and to write zero-bits of the second group of bits that are immediately adjacent to one-bits of the first group. In another implementation, such a controller may comprise circuitry to concurrently write zero-bits of a first group of bits to a first wordline and zero-bits of a second group of bits to a second wordline. As mentioned above, one-bits may correspond to a crystalline set state of a PCM cell and zero-bits may correspond to an amorphous reset state of the PCM cell. Such a non-volatile memory device may be incorporated in at least one of the following: a desktop computer, a laptop computer, a workstation, a server device, a personal digital assistant, a mobile communication device, or any combination thereof, though claimed subject matter is not so limited.

FIG. 1 is a schematic diagram of a portion of a memory array 100, according to an embodiment. For example, a memory device may comprise memory array 100 and address decoding circuitry (not shown) to read from or write to selected memory cells via bitlines or wordlines. Memory cells 150 may be connected at intersections of wordlines and bitlines and may be selectively addressed by the wordlines or bitlines. For example, memory cell 155 may be programmed to be in a zero-bit state by placing a zero-bit on wordline WL1 in a bitline BL1 position. Similarly, memory cell 157 may be programmed to be in a one-bit state by placing a one-bit on wordline WL2 in a bitline BL1 position. In another example, FIG. 1 shows wordline WL3 with bits 0-1-0-1 in bitline positions BL1, BL2, BL3, and BL4, respectively. Memory cells 150 may comprise PCM cells, though claimed subject matter is not so limited.

In an embodiment, adjacent wordlines in memory array 100 may be physically spaced apart by two different distances. For example, adjacent wordlines WL9 and WL10 may be spaced apart by a distance D1, while adjacent wordlines WL8 and WL9 may be spaced apart by a distance D2. The different spacing distances may be determined, at least in part, from fabrication architecture of a semiconductor memory device that includes memory array 100, for example. Thus, adjacent wordlines may be physically grouped in pairs with an inter-pair spacing of distance D1, whereas such pairs of wordlines may be spaced apart a distance D2. Referring to FIG. 1, for example, adjacent wordlines WL1 and WL2 comprise a wordline pair separated by a distance D1, adjacent wordlines WL3 and WL4 comprise a wordline pair separated by a distance D1, adjacent wordlines WL5 and WL6 comprise a wordline pair separated by a distance D1, adjacent wordlines WL7 and WL8 comprise a wordline pair separated by a distance D1, and adjacent wordlines WL9 and WL10 comprise a wordline pair separated by a distance D1. In contrast, wordline WL2 and wordline WL3, though they are adjacent to one another, may be separated by a distance D2, which may be greater than inter-pair spacing distance D1. To continue the example, wordline WL4 and wordline WL5 may be separated by a distance D2, wordline WL6 and wordline WL7 may be separated by a distance D2, and wordline WL8 and wordline WL9 may be separated by a distance D2.

As mentioned above, thermal contact among PCM cells may lead to a program-disturb event, wherein a state of one PCM cell may be disturbed by the state of a neighboring PCM cell. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. In memory array 100, for example, memory cells included in wordlines of a wordline pair may be physically near one another so as to be affected by a program-disturb event. More specifically, memory cells included in wordlines of a wordline pair along a same bitline may be physically near enough to one another so as to be affected by a program-disturb event. On the other hand, memory cells included in wordlines of different wordline pairs, even if on a same bitline, may be physically separated enough so as to not be substantially affected by a program-disturb event. Returning to FIG. 1, for example, memory cells in memory cell pair 110 may program-disturb one another, whereas memory cells in memory cell pair 120 need not program-disturb one another.

As discussed above, PCM cells in a zero-bit, amorphous state may be more susceptible to effects of a program-disturb event compared to PCM cells in a one-bit, crystalline state. For example, memory cells in zero-bit states in memory cell pair 110 may program-disturb one another, whereas memory cells 155 and 157 in zero-bit and one-bit states, respectively, need not program-disturb one another.

In one implementation, PCM cells in adjacent wordlines of wordline pairs may be more susceptible to effects of a program-disturb event compared to PCM cells in a same wordline and adjacent bitlines. Such effects may change a PCM memory cell in a zero-bit state to a one-bit state or vise versa. For example, memory cells in memory cell pair 130 need not program-disturb one another, even though the adjacent memory cells may both be in zero-bit states.

Accordingly, as discussed above, it may be desirable to arrange a particular order of one-bits and zero-bits to be written to memory cells in two adjacent wordlines (e.g., WL1 and WL2, WL3 and WL4, WL5 and WL6, and so on) at a time. For example, one-bits in WL1 and WL2 may be written before zero-bits in WL1 and WL2.

Figure 2:
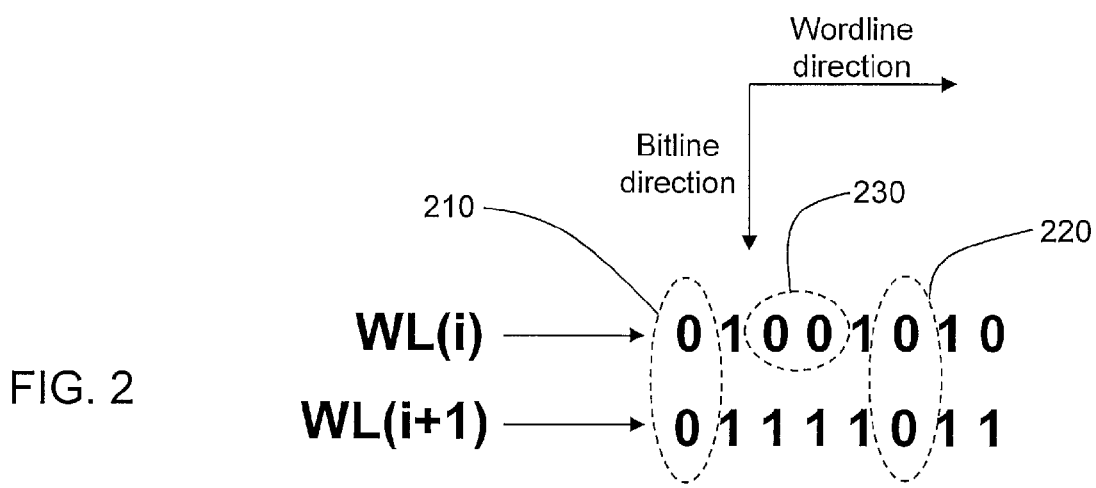
FIG. 2 is a schematic diagram of an arrangement of program bits on adjacent wordlines, according to an embodiment.

FIG. 2 is a schematic diagram of an arrangement of program bits on adjacent wordlines, according to an embodiment. FIG. 2 may depict a memory array similar to that of FIG. 1, but without explicitly showing memory cells, wordlines, and bitlines. For example, in FIG. 2, a wordline WL(i) (i comprises an integer) may have bits 0-1-0-0-1-0-1-0 on consecutive bitlines, such as BL1, BL2, BL3, and so on, shown in FIG. 1. An adjacent wordline WL(i+1) may have bits 0-1-1-1-1-0-1-1 on the same consecutive bitlines as for WL(i). As discussed above, PCM cells in a zero-bit, amorphous state may be more susceptible to effects of a program-disturb event compared to PCM cells in a one-bit, crystalline state. Also, PCM cells in adjacent wordlines may be more susceptible to effects of a program-disturb event compared to PCM cells in a same wordline and adjacent bitlines. Thus, zero-bit pair 210, comprising zero bits on a same bitline and adjacent wordlines WL(i) and WL(i+1), may lead to an undesirable program-disturb event. As another example, zero-bit pair 220, comprising zero bits on a same bitline and adjacent wordlines WL(i) and WL(i+1), may also lead to an undesirable program-disturb event. However, in another example, zero-bit pair 230, comprising zero bits on a same wordline WL(i) but adjacent bitlines, need not lead to a program-disturb event. Accordingly, as discussed above, it may be desirable to arrange a particular order of one-bits and zero-bits to be written to memory cells in two adjacent wordlines at a time.

Figure 3:
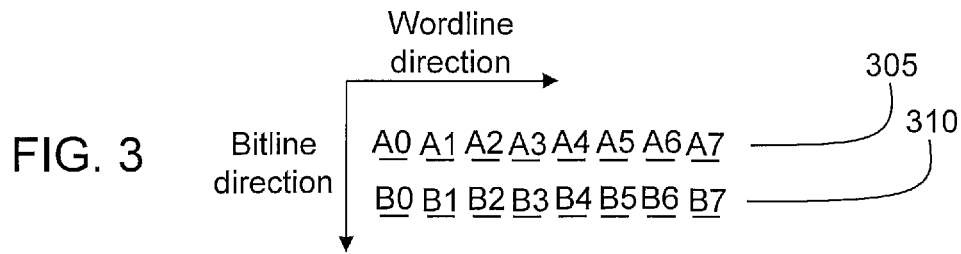
FIG. 3 is a schematic diagram to show notation for describing bit locations of an arrangement of program bits on adjacent wordlines, according to an embodiment.

FIG. 3 is a schematic diagram to show notation for describing bit locations of an arrangement of program bits on adjacent wordlines 305 and 310, according to an embodiment. For example, wordline 305 may comprise a wordline WL(i) and wordline 310 may comprise a wordline WL(i+1), for an integer i, as in FIGS. 2 and 4A-4D. For a particular notation, bits of a wordline may be described, from left to write, as A0, A1, A2, and so on for one wordline, and B0, B1, B2, and so on for another (e.g., adjacent) wordline. Of course, claimed subject matter is not limited in this respect.

Figure 4A:
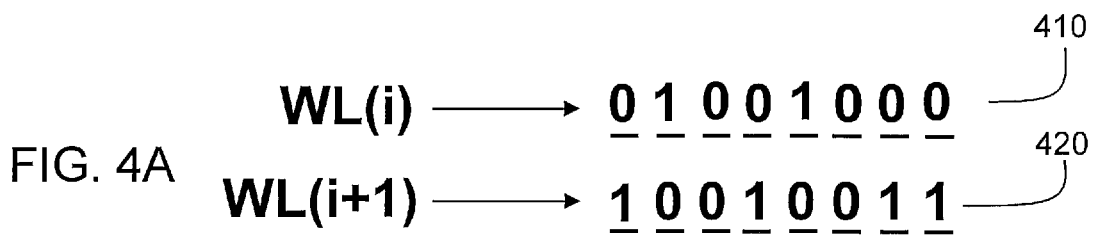
FIGS. 4A-4D are schematic diagrams of an arrangement of program bits on adjacent wordlines, according to an embodiment.
Figure 4B:
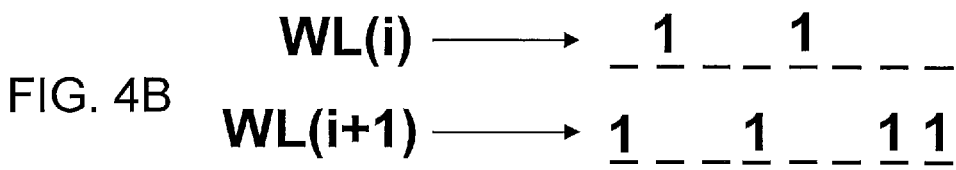
Figure 4C:
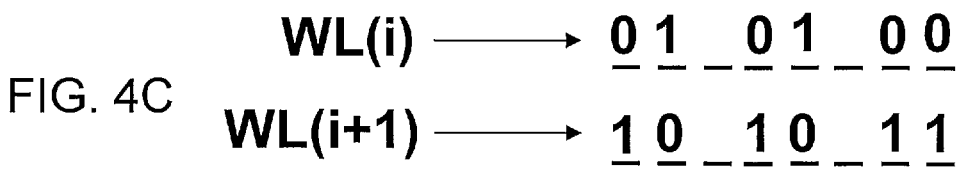
Figure 4D:
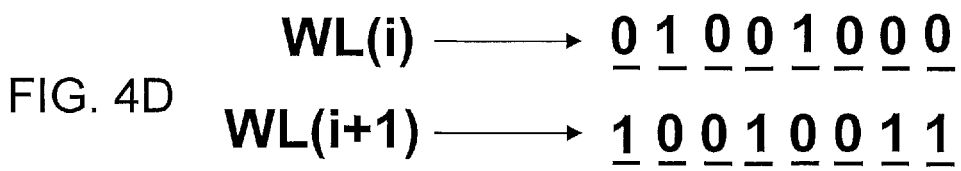
Figure 5:
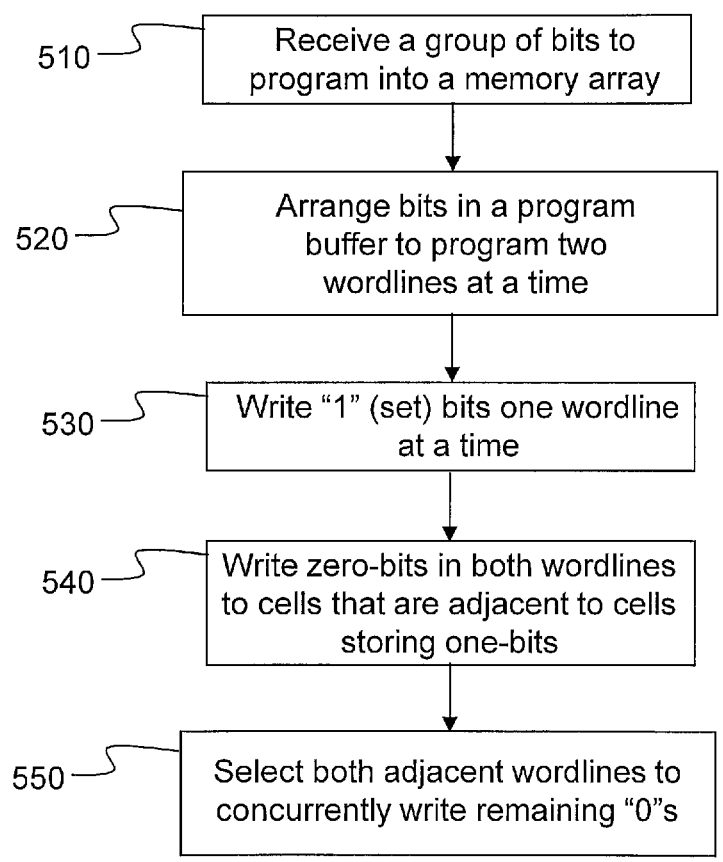
FIG. 5 is a flow diagram of an embodiment of a process to program bits in a memory array.

FIGS. 4A-4D are schematic diagrams of an arrangement of program bits on adjacent wordlines of a memory array, according to an embodiment. FIG. 5 is a flow diagram of an embodiment of a process 500 to program bits in a memory array, such as memory array 100 shown in FIG. 1, for example. Process 500 may comprise a technique to avoid or reduce a number of occurrences of program-disturb events. Process 500 may be performed by a memory controller, for example. A desirable outcome, for example, is that, during a process of programming a memory array, adjacent wordlines along same bitlines will not both be programmed with a zero-bit and a one-bit at the same time, regardless of the combination or ordering of bits to be written to the wordlines.

At block 510 of process 500, a group of bits to program into a memory array may be received. For example, a processor or memory controller may provide a group of bits to program into a memory array. A group of bits may comprise a byte, a word, or several to several hundred data bits, just to name a few examples. In particular, such a group of bits may comprise a first sequence of bits, such as 410, and a second sequence of bits 420. For example, bits 410 may be written to wordline WL(i) and bits 420 may be written to wordline WL(i+1). FIG. 4A shows bits to be written to wordlines WL(i) and WL(i+1) in this particular example, while FIGS. 4B-4D show a process for writing the bits.

At block 520, a group of bits may be arranged in a buffer so as to program two wordlines at a time, as explained above. A buffer may comprise a program buffer that may be included in a memory device that also includes the memory array. Such a buffer may comprise memory to temporarily store a plurality of bits 410 and 420 during a process of writing the bits to two adjacent wordlines, such as WL(i) and WL(i+1). Bits 410 and 420 may be written to the two adjacent wordlines in a particular sequence based, at least in part, on whether the bits comprise one-bits or zero-bits.

In a particular embodiment, program bits may comprise a first group of bits 410 to be written to a wordline WL(i) and a second group of bits 420 to be written to a second adjacent wordline WL(i+1). In such a case, referring to block 530 and FIG. 4B, one-bits of first group 410 may be written to wordline WL(i) before writing one-bits of second group 420 to adjacent wordline WL(i+1). Thus, referring to notation introduced in FIG. 3, one-bits A1 and A4 may be written to wordline WL(i) and one-bits B0, B3, B6, and B7 may be written to wordline WL(i+1). Remaining bits, comprising zero-bits, may be written in a process described below.

At block 540, subsequent to one-bits of the first and second groups of bits being written to the two wordlines, zero-bits may be written to the two wordlines in the following manner. Zero-bits of the first group of bits that are to be written to the first wordline may be written to memory cell locations that are immediately adjacent to one-bits of the adjacent second wordline. For example, referring to FIG. 4C, zero-bit A0 on wordline WL(i) may be adjacent to one-bit B0 on wordline WL(i+1). In other words, A0 and B0 may be on a same bit line. Likewise, zero-bits of the second group of bits that are to be written to the second wordline may be written to memory cell locations that are immediately adjacent to one-bits of the adjacent first wordline. In further examples, zero-bit B1 on wordline WL(i+1) may be adjacent to one-bit A1 on wordline WL(i); zero-bit A3 on wordline WL(i) may be adjacent to one-bit B3 on wordline WL(i+1); zero-bit B4 on wordline WL(i+1) may be adjacent to one-bit A4 on wordline WL(i); zero-bit A6 on wordline WL(i) may be adjacent to one-bit B6 on wordline WL(i+1); and zero-bit A7 on wordline WL(i) may be adjacent to one-bit B7 on wordline WL(i+1).

At block 550, subsequent to one-bits of the first and second groups of bits being written to the two wordlines (e.g., block 530 and FIG. 4B) and subsequent to writing zero-bits adjacent to one-bits (e.g., block 540 and FIG. 4C) zero-bits may be written to the first wordline WL(i) while simultaneously writing zero-bits to the second wordline WL(i+1). In one embodiment, a portion of process 500 comprising block 540 need not be performed so that process 500 may proceed from block 530 to block 550, for example. Thus, if block 540 is performed, zero-bits A2 and A5 may be written to the first wordline WL(i) while simultaneously writing zero-bits B2 and B5 to the second wordline WL(i+1). On the other hand, if block 540 is not performed, zero-bits A0, A2, A3, A5, A6, and A7 may be written to the first wordline WL(i) while simultaneously writing zero-bits B1, B2, B4, and B5 to the second wordline WL(i+1). Process 500 merely describes an example of a programming embodiment, but other programming techniques may be used. Also, various portions or details of process 500 may be changed. Accordingly, details of process 500 are merely examples, and claimed subject matter is not so limited.

Figure 6:
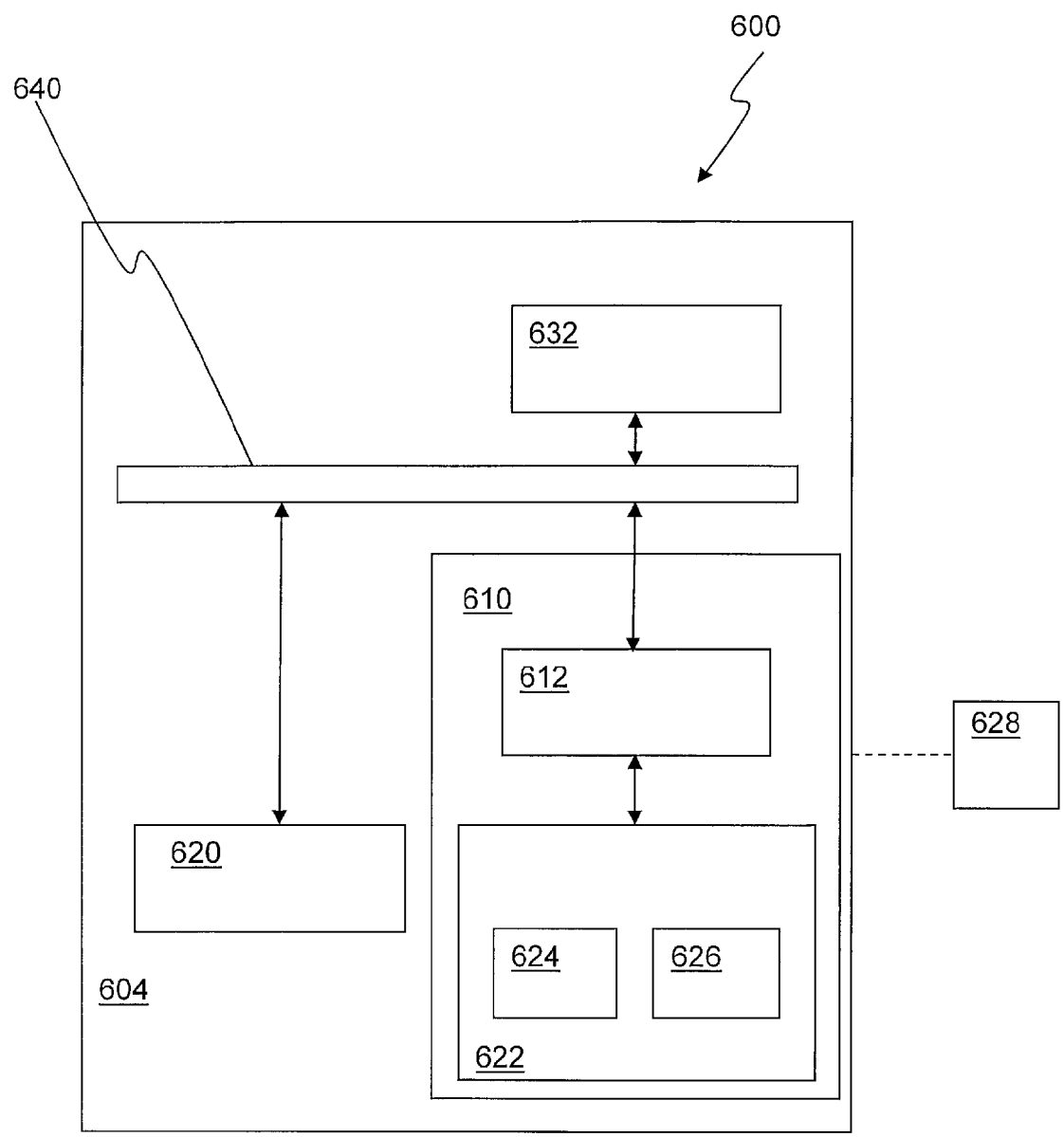
FIG. 6 is a schematic diagram illustrating an embodiment of a computing system.

FIG. 6 is a schematic diagram illustrating an embodiment of a computing system 600 including a memory device 610. Such a computing device may comprise one or more processors, for example, to execute an application or other code. For example, memory device 610 may comprise memory array 100, shown in FIG. 1. A computing device 604 may be representative of any device, appliance, or machine that may be configurable to manage memory device 610. Memory device 610 may include a memory controller 615 and a memory 622, which may comprise PCM, for example. By way of example but not limitation, computing device 604 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider/system; or any combination thereof. It is recognized that all or part of the various devices shown in system 600, and the processes and methods as further described herein, may be implemented using or otherwise including hardware, firmware, software, or any combination thereof. Thus, by way of example but not limitation, computing device 604 may include at least one processing unit 620 that is operatively coupled to memory 622 through a bus 640 and a host or memory controller 615.

Processing unit 620 is representative of one or more circuits configurable to perform at least a portion of an information computing procedure or process. By way of example but not limitation, processing unit 620 may include one or more processors, controllers, microprocessors, microcontrollers, application specific integrated circuits, digital signal processors, programmable logic devices, field programmable gate arrays, and the like, or any combination thereof. Processing unit 620 may include an operating system configured to communicate with memory controller 615. Such an operating system may, for example, generate commands to be sent to memory controller 615 over bus 640. Such commands may comprise read or write commands. In response to a write command, for example, memory controller 615 may arrange program bits into a buffer so as to write the bits to two adjacent wordlines at a time, and may write one-bits to the two adjacent wordlines before writing zero-bits to the two adjacent wordlines. Of course, such details of a portion of memory are merely examples, and claimed subject matter is not so limited.

Memory 622 is representative of any information storage mechanism. Memory 622 may include, for example, a primary memory 624 or a secondary memory 626. Primary memory 624 may include, for example, a random access memory, read only memory, etc. While illustrated in this example as being separate from processing unit 620, it should be understood that all or part of primary memory 624 may be provided within or otherwise co-located/coupled with processing unit 620.

Secondary memory 626 may include, for example, the same or similar type of memory as primary memory or one or more information storage devices or systems, such as, for example, a disk drive, an optical disc drive, a tape drive, a solid state memory drive, etc. In certain implementations, secondary memory 626 may be operatively receptive of, or otherwise configurable to couple to, a computer-readable medium 628. Computer-readable medium 628 may include, for example, any medium that can carry or make accessible information, code, or instructions for one or more of the devices in system 600. Computing device 604 may include, for example, an input/output 632. Input/output 632 is representative of one or more devices or features that may be configurable to accept or otherwise introduce human or machine inputs, or one or more devices or features that may be configurable to deliver or otherwise provide for human or machine outputs. By way of example but not limitation, input/output device 632 may include an operatively configured display, speaker, keyboard, mouse, trackball, touch screen, data port, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to lead to performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

The terms, "and" and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Embodiments described herein may include machines, devices, engines, or apparatuses that operate using digital signals. Such signals may comprise electronic signals, optical signals, electromagnetic signals, or any form of energy that provides information between locations.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
    selecting two adjacent wordlines of a memory cell array;
    arranging program bits to be written to said memory cell array into a buffer so as to write said bits to both of said two adjacent wordlines, said program bits comprising zero-bits and one-bits; and
    writing said one-bits to both of said two adjacent wordlines before writing said zero-bits to both of said two adjacent wordlines.

2. The method of claim 1, wherein said program bits comprise:
    a first group of bits to be written to a first of said two adjacent wordlines; and
    a second group of bits to be written to a second of said two adjacent wordlines.

3. The method of claim 2, wherein said first group of bits and said second group of bits comprise respective words or bytes.

4. The method of claim 2, wherein writing said one-bits comprises:
    writing one-bits of said first group of bits to said first wordline before writing one-bits of said second group of bits to said second wordline.

5. The method of claim 4, wherein writing said zero-bits comprises:
    writing zero-bits of said first group of bits that are immediately adjacent to said one-bits of said second group; and
    writing zero-bits of said second group of bits that are immediately adjacent to said one-bits of said first group.

6. The method of claim 4, wherein writing said zero-bits comprises:
    concurrently writing:
        zero-bits of said first group of bits to said first wordline; and
        zero-bits of said second group of bits to said second wordline.

7. The method of claim 1, wherein said one-bits correspond to a crystalline set state of a PCM cell and said zero-bits correspond to an amorphous reset state of said PCM cell.

8. The method of claim 1, wherein said memory cell array includes said buffer.

9. A non-volatile memory device comprising:
a controller to:
  select two adjacent wordlines of a memory cell;
  arrange program bits to be written to said memory cell array into a buffer so as to write said bits to both of said two adjacent wordlines, said program bits comprising zero-bits and one-bits; and
  write said one-bits to both of said two adjacent wordlines before writing said zero-bits to both of said two adjacent wordlines.

10. The non-volatile memory device of claim 9, wherein said program bits comprise:
  a first group of bits to be written to a first of said two adjacent wordlines; and
  a second group of bits to be written to a second of said two adjacent wordlines.

11. The non-volatile memory device of claim 10, wherein said first group of bits and said second group of bits comprise respective words or bytes.

12. The non-volatile memory device of claim 10, wherein said controller comprises circuitry to:
  write one-bits of said first group of bits to said first wordline before writing one-bits of said second group of bits to said second wordline.

13. The non-volatile memory device of claim 12, wherein said controller comprises circuitry to:
  write zero-bits of said first group of bits that are immediately adjacent to said one-bits of said second group; and
  write zero-bits of said second group of bits that are immediately adjacent to said one-bits of said first group.

14. The non-volatile memory device of claim 12, wherein said controller comprises circuitry to concurrently write:
  zero-bits of said first group of bits to said first wordline; and
  zero-bits of said second group of bits to said second wordline.

15. The non-volatile memory device of claim 9, wherein the memory device is incorporated in at least one of the following: a desktop computer, a laptop computer, a workstation, a server device, a personal digital assistant, a mobile communication device, or any combination thereof.

16. A system comprising:
a memory cell array;
a processor to host one or more applications and to initiate a write operation to store program bits in said memory cell array; and
a controller to:
  select two adjacent wordlines of said memory cell;
  arrange said program bits into a buffer so as to write said bits to both of said two adjacent wordlines, said program bits comprising zero-bits and one-bits; and
  write said one-bits to both of said two adjacent wordlines before writing said zero-bits to both of said two adjacent wordlines.

17. The system of claim 16, wherein said program bits comprise:
  a first group of bits to be written to a first of said two adjacent wordlines; and
  a second group of bits to be written to a second of said two adjacent wordlines.

18. The system of claim 17, wherein said controller comprises circuitry to:
  write one-bits of said first group of bits to said first wordline before writing one-bits of said second group of bits to said second wordline.

19. The system of claim 18, wherein said controller comprises circuitry to:
  write zero-bits of said first group of bits that are immediately adjacent to said one-bits of said second group; and
  write zero-bits of said second group of bits that are immediately adjacent to said one-bits of said first group.

20. The system of claim 19, wherein said controller comprises circuitry to concurrently write:
  zero-bits of said first group of bits to said first wordline; and
  zero-bits of said second group of bits to said second wordline.

* * * * *